United States Patent [19]

Povenmire

[11] Patent Number: 5,111,191
[45] Date of Patent: May 5, 1992

[54] METHOD AND APPARATUS FOR WAVEFORM DIGITIZATION

[75] Inventor: Richard M. Povenmire, Mesa, Ariz.

[73] Assignee: Motorola, Inc., Schaumburg, Ill.

[21] Appl. No.: 502,710

[22] Filed: Apr. 2, 1990

Related U.S. Application Data

[62] Division of Ser. No. 210,460, Jun. 23, 1988, Pat. No. 5,028,914.

[51] Int. Cl.$^5$ ............................................. G09G 5/18
[52] U.S. Cl. ................................... 340/720; 340/723; 340/747; 340/789; 340/811; 324/121 R; 328/151; 307/352
[58] Field of Search ............... 340/715, 720, 723, 747, 340/789, 811; 324/121 R; 328/150, 151; 307/352, 353; 315/364

[56] References Cited

U.S. PATENT DOCUMENTS

| | | | |
|---|---|---|---|
| 4,283,713 | 8/1981 | Philipp | 324/121 R |
| 4,350,953 | 9/1982 | Best et al. | 324/121 R |
| 4,399,512 | 8/1983 | Soma et al. | 324/121 R |
| 4,555,765 | 11/1985 | Crooke et al. | 324/121 R |
| 4,634,970 | 1/1987 | Payne et al. | 324/121 R |
| 4,694,244 | 9/1987 | Whiteside et al. | 324/121 R |
| 4,704,691 | 11/1987 | Blair | 324/121 R |
| 4,719,416 | 1/1988 | Desautels | 324/121 R |
| 4,843,309 | 6/1989 | Kareem et al. | 324/121 R |
| 4,937,037 | 6/1990 | Griffiths et al. | 324/121 R |

Primary Examiner—Alvin E. Oberley
Assistant Examiner—Richard Hjerpe
Attorney, Agent, or Firm—Frank J. Bogacz

[57] ABSTRACT

Waveform digitization techniques and apparatus are shown. An input waveform is shown on a display device such as an oscilloscope as a high density sequence of either horizontal or vertical line segments which track the overall shape of the waveform. This digitization technique includes determining minimum and maximum values of the input waveform and storing these as sets. As these minimum and maximum samples are collected, each sample is compared with a previous minimum and maximum value that had been found during a current line period. The minimum and maximum values for the total line period are stored in a memory. Under processor control these sets of minimum and maximum samples are displayed on a visual display device such as an oscilloscope.

5 Claims, 7 Drawing Sheets

METHOD AND APPARATUS FOR WAVEFORM DIGITIZATION

This is a division of application Ser. No. 210,460, filed June 23, 1988, now U.S. Pat. No. 5,028,914.

BACKGROUND OF THE INVENTION

The present invention pertains to sampling and display systems and more particularly to waveform sampling and digitization for use in digital display devices or oscilloscopes.

Devices such as ocilloscopes permit the physical display or graphing of voltage, on a vertical axis, versus time, on a horizontal axis. From this visual display or graph, it may be determined how much of a given signal is direct current, how much is alternating current, how much is noise, what the frequency of the signal is and the manner in which the signal changes with time. These aspects of a signal can be displayed in analog form as part of one test using conventional oscilloscopes.

These conventional oscilloscopes accept an input signal. The scope scans the signal vertically and horizontally, that is to determine how the signal changes with voltage and with time. The oscilloscope is then triggered at a particular voltage or time to output an analog representation of the input signal on a display device such as a cathode ray tube. The electron beam of the cathode ray tube is deflected horizontally and vertically to graph or draw an image of the input signal as it changes in time and voltage.

Digital oscilloscopes are desirable since they can faithfully represent the input waveform with high resolution. However, digitally displaying a signal on an analog display device such as an oscilloscope is difficult.

One circuit for controlling the digital display of waveforms is shown in U.S. Pat. No. 4,654,584, issued on Mar. 31, 1987, to C. Gyles. A sampling system is shown in U.S. Pat. No. 4,536,760, issued on Aug. 20, 1985, to L. Navarro.

Accordingly, it is an object of the present invention to provide circuitry for depicting a digital representation of waveforms on an analog display device.

SUMMARY OF THE INVENTION

In accomplishing the object of the present invention, a novel method and apparatus for waveform digitization is shown.

An apparatus for waveform ditigization includes a timer which produces a plurality of periodic pulses. An analog-to-digital converter is connected to the timer and converts an incoming waveform to a number N-bits of digital information representing the sampled input waveform.

A first circuit for determining a maximum is connected to the analog-to-digital converter. This first circuit determines the maximum value of the sampled input waveform over a predetermined time or line period. A second circuit for determining a minimum value is also connected to the analog-to-digital converter. The second circuit determines the minimum value over a predetermined time period or line period. The minimum and maximum value determinations are accomplished by comparing the current minimum and maximum values with the previously determined minimum and maximum values. When the line period or predetermined time has ended, each minimum and maximum value set, unique to a particular vertical pixel line, is stored in a memory. This is repeated over the frequency of the input waveform. Lastly, a processor reads these stored minimum and maximum sets and displays line segments for each vertical pixel line by connecting these minimum and maximum values on a display device such as an oscilloscope.

DESCRIPTION OF THE PREFERRED EMBODIMENT

Figure 1:
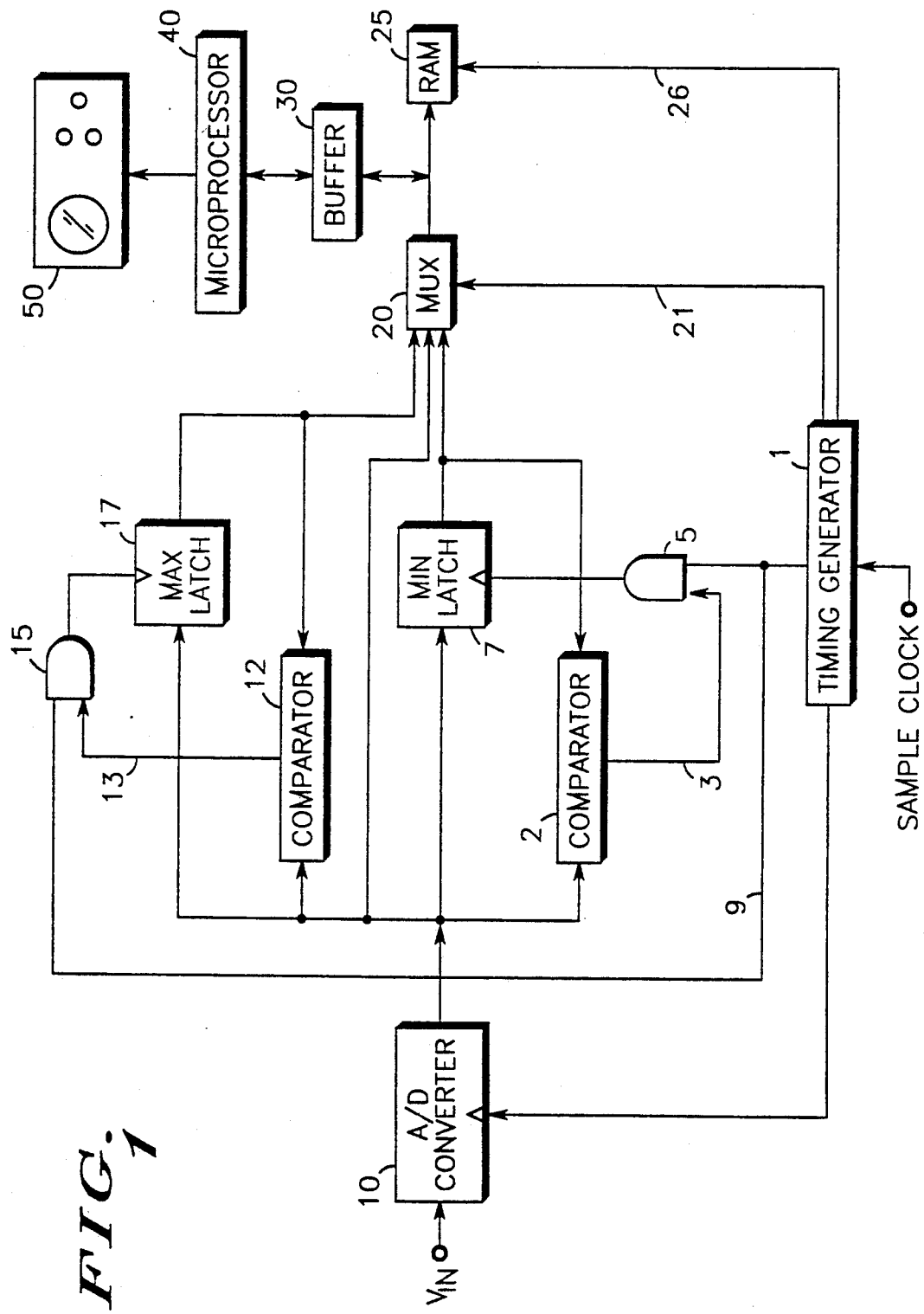
FIG. 1 is a block diagram of the minimum/maximum storage circuit for waveform digitization.

FIG. 1 depicts the minimum/maximum storage circuit for the sampling method for waveform digitization of the present invention. A sample clock signal is input to timing generator 1. Timing generator 1 is connected to gates 5 and 15, to analog-to-digital converter 10, to multiplexer 20 and to RAM 25. Timing generator 1 produces a plurality of periodic pulses to activate and control gates 5 and 15, analog-to-digital converter 10, multiplexer 20 and RAM memory 25.

The periodic pulses sent from the timing generator 1 to analog-to-digital converter 10 cause converter 10 to convert the input voltage waveform VIN to a number of N-bits. These N-bits, which represent the present value of the voltage waveform input in digital form, are compared to the N-bits representing the voltage input of the previous sample period by comparator 12. The larger of the two samples is stored in latch 17. In accomplishing this, the signal on lead 9 is transmitted through gate 15 to latch 17. If the results of comparator 12 indicate that the previously stored sample in latch 17 is greater, the signal on lead 13 will be a logic 0 and thereby prevent the new sample from being transferred from converter 10 to latch 17. If, however, the present sample stored in converter 10 is larger than the previously stored sample in latch 17, the signal on lead 13 will be a logic 1 and the output of gate 15 will be such that latch 17 will be enabled to store the new sample of converter 10.

Simultaneous with the above comparison for detecting the maximum, a second comparison is made to detect the minimum or smaller of the present voltage sample or previously stored minimum sample. The previous sample stored in latch 7 is transmitted to comparator 2 along with the present sample value from converter 10. Comparator 2 compares the present sample value with the previously stored sample value in latch 7. The resulting output signal on lead 3, if a logic 1, indicates that the present sample in converter 10 is less than the previously stored sample in latch 7. As a result, gate 5 operates latch 7 to store the present sample of converter 10 as a new minimum value. If the previously stored value in latch 7 was the smaller of the two sample values, comparator 2 outputs a logic 0 on lead 3 and gate 5 inhibits the storing of the present value of converter 10. Gates 5 and 15 are both operated at the correct time by the timing signal on lead 9 which is output from timing generator 1.

At a time after the duration of the sampling period and storage of both the new minimum and maximum values in latches 7 and 17 respectively, multiplexer 20 is operated by signal 21 of timing generator 1. First multiplexer 20 is operated to transmit the minimum value of latch 7 to RAM memory 25 where it is stored under the control of timing signal 26. Next, multiplexer 20 is operated by signal 21 to transmit the maximum value of latch 17 to a next sequential location relative to the minimum in RAM 25. Again, signal 26 controls the storing of the maximum in RAM 25.

RAM 25 is sufficiently large to contain many samples, since the display device 50 operates at a much slower rate than the sampling circuitry shown. Display device 50 may be an oscilloscope or similar device.

Microprocessor 40 via buffer 30 unloads sets of minimum and maximum values from RAM memory 25. Each of the sets of minimum and maximum values of a given sampling period comprise a data set. Each data set is read from RAM memory 25 by microprocessor 40 through buffer 30. Next, the microprocessor determines the length of a vertical line segment which connects the minimum and maximum values of each data set. This vertical line segment is then displayed on display device 50. The above steps of sampling, storing, reading, calculating and displaying are repeated for each of the stored data sets in RAM 25 for a duration determined by the sample clock signal. Since the sampling rate is much greater than the frequency of the VIN signal, the display seen on display device 50 appears to be a number of vertical line segments which track the frequency of the VIN signal input.

Figure 3A:
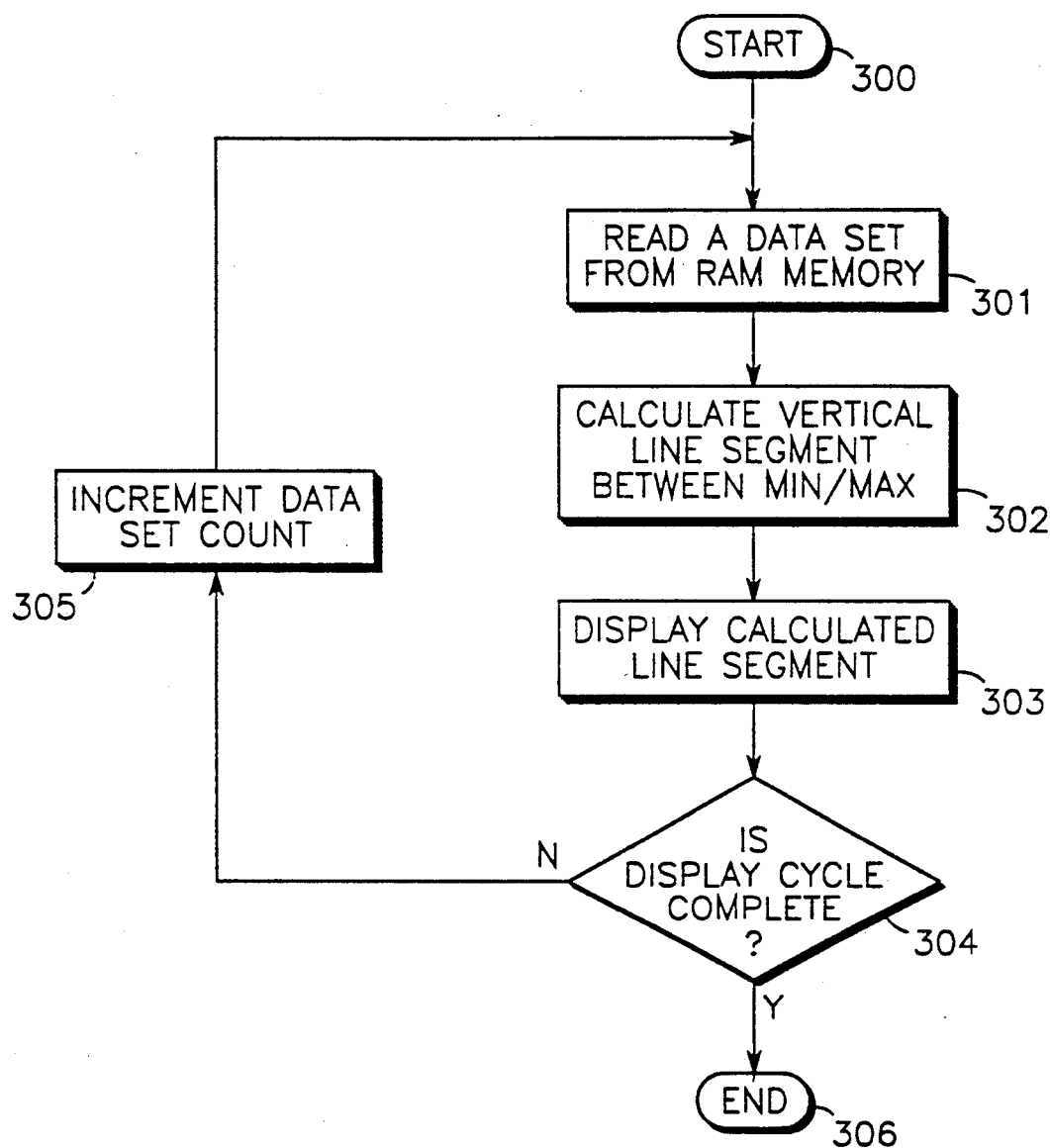
FIG. 3A is a flow chart of a method for vertical display of a digital waveform.

Referring to FIG. 3A, the microprocessor's operation is shown for display of low frequency (with respect to the system's sampling frequency) data in RAM memory 25. This process is executed by the software of microprocessor 40. The operation is initiated at start block 300. Next, an initial set of minimum and maximum values is read from RAM memory 25, block 301. Block 302 calculates the length of the vertical line segment between the minimum value and maximum value of the particular set read from RAM memory. The line segment is then displayed on its unique vertical pixel line on an oscilloscope or similar device, block 303.

Block 304 determines whether the display cycle of the oscilloscope is complete. If the display cycle is not complete, block 304 transfers control to block 305 via the N path. Block 305 then increments a data set count which selects the next sequential data set stored in RAM memory 25. Then, the steps of blocks 301, 302, 303 and 304 are repeated until the display cycle is complete. When the display cycle is complete, the Y path is followed from block 304 and the process is ended, block 306.

Figure 3B:
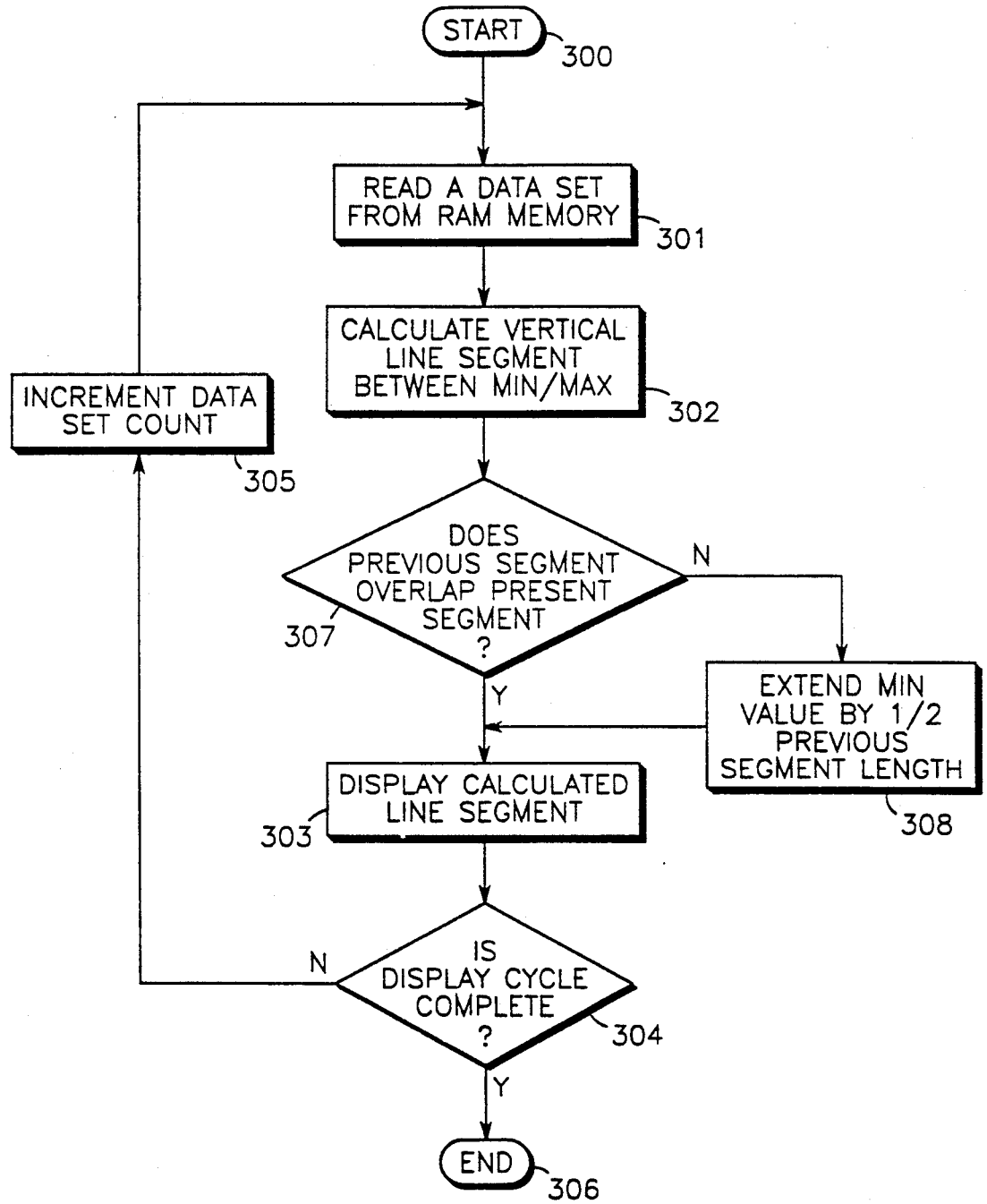
FIG. 3B is a flow chart of a method for vertical display of a digital waveform.

Referring to FIG. 3B, a method similar to that shown in FIG. 3A is described, except that FIG. 3B pertains to a display of a rapidly rising (intermediate frequency with respect to the system's sampling frequency) voltage input signal (VIN). Specifically, this case occurs when the maximum value of a predetermined time period is slightly less than the minimum value of the following time period. In this case the adjacent vertical line segments will almost overlap. This process operates similarly to that described above for FIG. 3A except that at block 307 a determination is made. Does the length of the line segment representing the present sample (maximum-minimum) overlap by a sufficient amount the length of the line segment representing the previous sample (maximum-minimum), block 307? If the answer is yes, the Y path is followed from block 307 and block 303 is entered. This remaining processing occurs as described above.

If the present and preceding line segments do not overlap, a visual discontinuity would be observed in the display of the oscilloscope. The amount of overlap required for triggering this process may be selected in a predetermined fashion. If the present and previous line segments do not overlap beyond this threshold, block 307 transfers control to block 308 via the N path. Block 308 extends the minimum value of the present line segment by one half the value of the length of the previous line segment. Block 308 then transfers control to block 303 and the remainder of the process is the same as described for FIG. 3A above.

This extension of the minimum value permits the human eye to observe a more continuous display. Therefore, the display is more readable and provides for higher resolution. For a rapidly declining voltage input (VIN), the above process is reversed. That is, one half the length of the previous line segment is added to the maximum value of the present line segment.

Figure 3C:
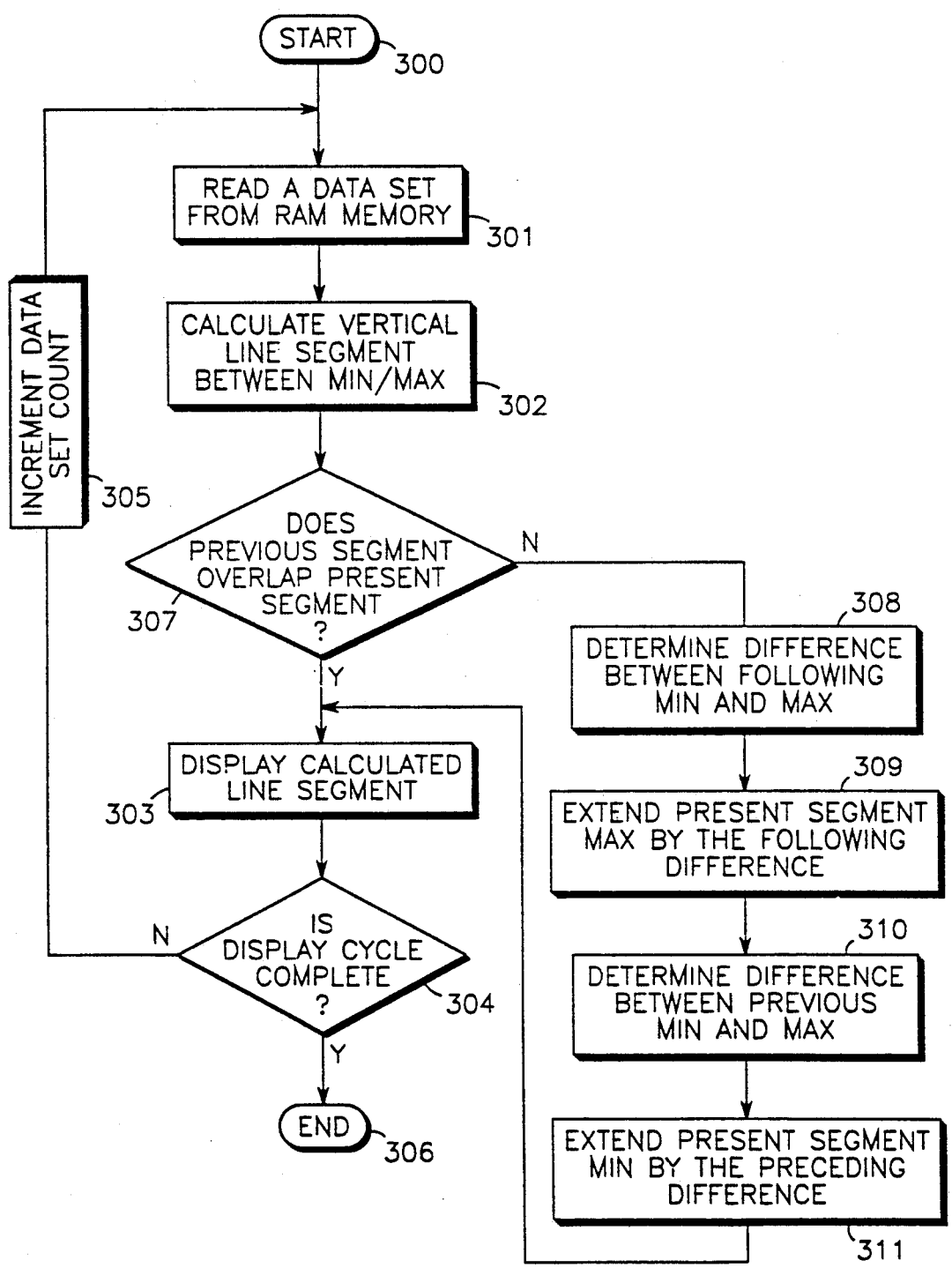
FIG. 3C is a flow chart of a method for vertical display of a digital waveform.

For the case of a rapidly changing (high frequency with respect to the system's sampling frequency) VIN signal, microprocessor 40 will use the processing arrangement shown in FIG. 3C. A high frequency signal is defined as the case when the maximum value for each time period is significantly less than the minimum value for the following time period. As in FIG. 3B, block 307 determines whether the previous segment overlaps by a sufficient amount the present line segment. If there is not enough overlap, block 307 transfers control to block 308. Block 308 determines the difference between the following line segment minimum and maximum values. That is, this the value of the line segment following the present line segment to be displayed.

Next, block 309 extends the present line segment maximum by the difference of the following maximum value minus the following minimum value. Block 310 determines the difference between the previous line segment's minimum and maximum. Block 311 extends the present line segment's minimum by the difference in the preceding line segment's maximum value minus minimum value. Block 311 then transfers control to block 303 and processing is the same as described in FIG. 3B.

As a result, the process shown in FIG. 3C provides a more enhanced overlapping of the vertical line segments and therefore, more resolution for rapidly changing VIN signals.

Figure 4A:
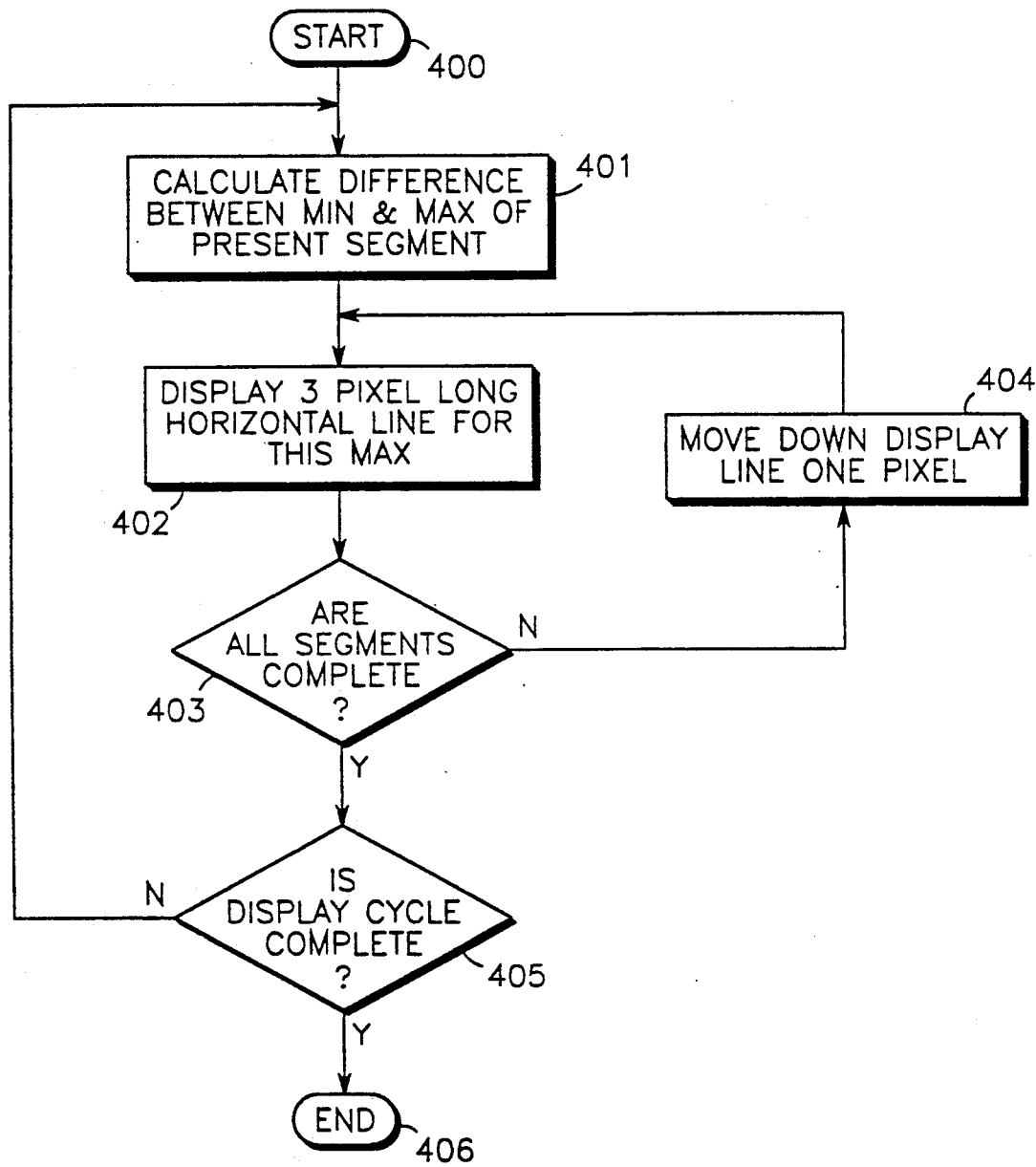
FIG. 4A is a flow chart of a method for horizontal display of a digital waveform.

For situations when the VIN signal is jittering, a display in accordance with the process of FIG. 4A is employed to generate a horizontal digital display. The process is started at block 400. Block 401 calculates the difference between the minimum and maximum values of the present line segment. A three-pixel long horizontal line segment is displayed at the voltage level corresponding to the minimum value of the present line segment. This three-pixel long horizontal line extends from the previous vertical line segment to the following vertical line segment and therefore the line extends over three adjacent vertical pixels, block 402.

Next, block 403 determines whether all horizontal line segments have been drawn. If not, the N path from block 403 is followed to block 404. Block 404 moves the display downward or lower in voltage one-pixel. Block 404 transfers control block 402. Block 402 displays a three-pixel long horizontal line at the new location which is one-pixel line lower than the previous horizontal pixel line. Block 403 is again entered which determines whether all the evenly spaced horizontal segments are complete. The horizontal segments are complete when the number of horizontal lines drawn is equal to the difference between the maximum and minimum values of the present vertical line segment.

When all the horizontal line segments have been drawn, block 403 transfers control to block 405 via the Y path. Block 405 determines whether the clock cycle is complete. If the display cycle is not complete, the N path is followed to block 401. Block 402 through 404 are iterated for the complete display cycle. When the display cycle is complete, block 405 transfers control via the Y path to block 406 and the process is ended.

Figure 4B:
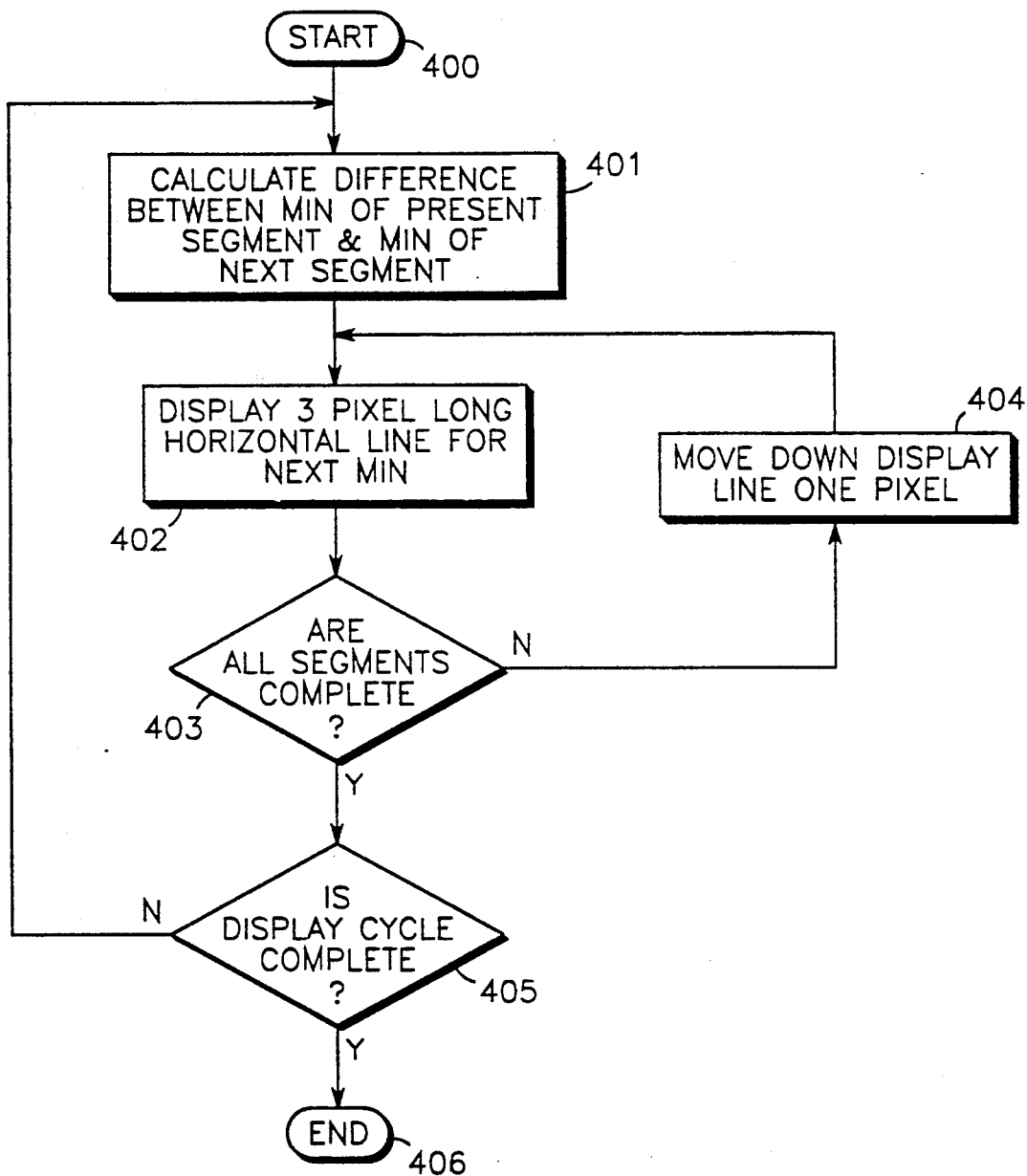
FIG. 4B is a flow chart of a method for horizontal display of a digital waveform.

FIG. 4B depicts another process used by microprocessor 40 for the case when VIN is jittering and VIN is in the intermediate or high frequency ranges as previously defined. Block 400 starts the process. Next, block 401 calculates the difference between the minimum value of the present segment and the minimum value of the next segment. Block 402 displays a three-pixel long horizontal line placed at the minimum value for the next line segment. This three-pixel long horizontal line extends from the previous line segment to the following vertical line segment.

Next, block 403 determines whether all the segments have been complete. All the segments are complete when the step of block 402 has been iterated a number of times to evenly space three-pixel lines between the minimum value of this and the next line segment. If all segments have not been complete, block 403 transfers control via the N path to block 404. Block 404 moves the display line down one pixel. Block 404 then transfers control to block 402. Block 402 displays another horizontal line segment lower than the previous horizontal line segment.

Again block 403 is entered and determines whether all line segments have been completed. If so, block 403 transfers control to block 405. Block 405 determines whether the display cycle is complete. If the display cycle is not complete, block 405 transfers control to block 401. As a result, blocks 401 through 404 are iterated until the display cycle is complete. When the display cycle is complete, block 405 transfers control to block 406 via the Y path and the process is ended.

Figure 2:
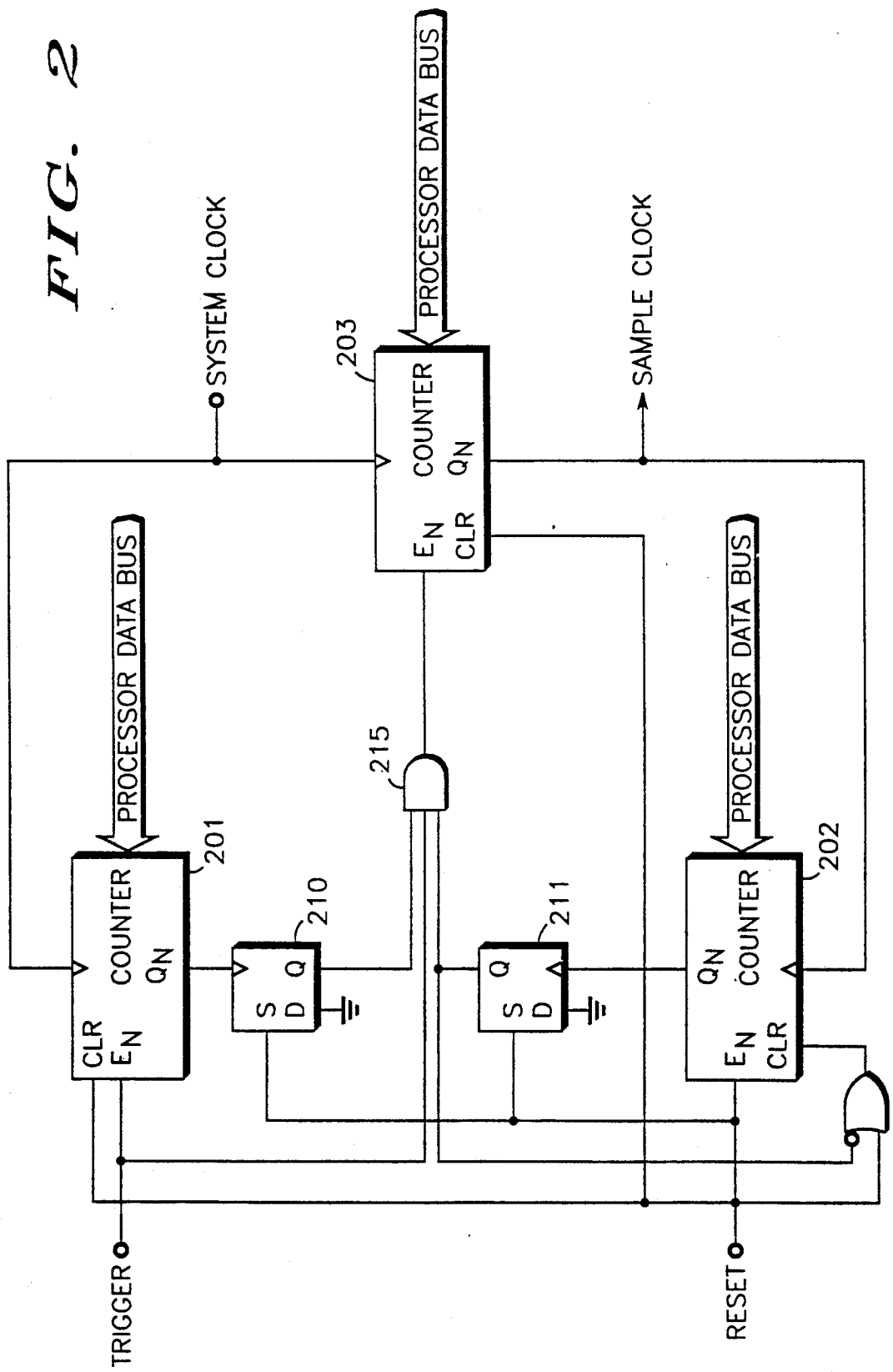
FIG. 2 is a schematic diagram of a staggered sample clock circuit for waveform digitization.

Referring to FIG. 2, a circuit for producing a staggered sample clock is shown. This circuit produces sample clock pulses which are delayed incrementally from a trigger point on the voltage input waveform. This circuit operates to capture periodic waveforms by increasing the delay time that each sample clock starts relative to the trigger point in order to capture different points on the waveform. By performing this staggered sampling approach a number of times, the entire waveform may be captured. This is particularly useful for waveforms which change very rapidly compared with the sampling rate of this system.

This circuit has as inputs a TRIGGER signal and a RESET signal and a SYSTEM CLOCK signal. These signals are transmitted from system control circuitry (not shown). The output is the SAMPLE CLOCK signal which is used to drive the minimum/maximum storage circuit shown in FIG. 1. Counters 201, 202 and 203 are connected to the processor via the processor's data bus.

Counter 203 is a programmable divide counter which divides down the SYSTEM CLOCK signal to produce the SAMPLE CLOCK signal. Counter 202 is loaded by the processor with the number of samples to be acquired during each acquisition pass. It counts each sample clock edge until a zero count is achieved and then terminates the sampling process.

Counter 201 is loaded by the processor with the count value which indicates the delay time from the trigger point to the time at which sample clocks are output by counter 203.

When the trigger signal is at logic 1, counter 201 counts down from the preprogrammed count value to zero. When counter 201 achieves its zero count, it clocks flip-flop 210. The output of flip-flop 210 is gated through gate 215 to enable counter 203 to produce sample clock signals.

As the sample clock signals are produced, counter 202 counts down from its preprogrammed value until it reaches zero. At this time, counter 202 clocks flip-flop 211 which is connected to counter 203 via gate 215. As a result of flip-flop 211 being set, gate 215 disables counter 203. This halts the acquisition cycle until the system processor initiates a next acquisition cycle.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A circuit for producing a sample clock signal to stagger samples of a high frequency input waveform, said circuit comprising:

processor means for providing values;
clock means for producing periodic signals;
first counter means connected to said processor means and to said clock means and operating in response to said periodic signals to count from a predetermined first value of said processor means to zero;
first latching means connected to said first counter means and operating in response to said zero count of said first counter means to store an indication of said zero count;
second counter means coupled to said processor means and to said clock, said second counter means operating in response to said periodic signals to count from a predetermined second value to zero;
second latching means connected to said second counter means and operating to store an indication of said zero count of said second counter means; and
third counter means coupled to said first and second latching means, said third counter means operating in response to said zero indication of said first latching means to produce said sample clock signal and in response to said zero indication of said second latching means to inhibit production of said sample clock signal.

2. A circuit for producing a sample clock signal as claimed in claim 1, where there is further included gating means connected to said first and second latching means and to said third counting means, said gating means operating to control said third counting means to produce and to inhibit production of said sample clock signal.

3. A circuit for producing a sample clock signal as claimed in claim 2, said first latching means including flip-flop means, said flip-flop means being connected to a source of a reset signal.

4. A circuit for producing a sample clock signal as claimed in claim 3, wherein said second latching means includes flip-flop means, said flip-flop means being connected to said source of said reset signal.

5. A circuit for producing a sample clock signal as claimed in claim 4, wherein said gating means includes:
   And gating means connected to said flip-flop means of said first and second latching means, to a source of said input waveform and to said third counter means; and
   OR gating means connected to said flip-flop means of said second latching means, to said source of said reset signal and to said second counter means.

* * * * *